United States Patent
Abraham et al.

(10) Patent No.: US 7,167,059 B2
(45) Date of Patent: Jan. 23, 2007

(54) CIRCUIT FOR GENERATING SPREAD SPECTRUM CLOCK

(75) Inventors: Robert A. Abraham, Albany, OR (US); Scott R. Weaver, Philomath, OR (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 49 days.

(21) Appl. No.: 10/820,691

(22) Filed: Apr. 8, 2004

(65) Prior Publication Data

US 2005/0225402 A1   Oct. 13, 2005

(51) Int. Cl.
*H03L 7/00* (2006.01)
*H03B 29/00* (2006.01)
*H04B 1/69* (2006.01)

(52) U.S. Cl. .......................... 331/78; 331/16; 375/130

(58) Field of Classification Search ................ 327/157; 331/34, 78, 16; 375/374, 130
See application file for complete search history.

(56) References Cited

U.S. PATENT DOCUMENTS

| | | | |
|---|---|---|---|
| 4,578,649 A | 3/1986 | Shupe | |
| 5,610,955 A | 3/1997 | Bland | |
| 5,614,869 A | 3/1997 | Bland | |
| 5,631,920 A | 5/1997 | Hardin | |
| 6,046,646 A * | 4/2000 | Lo et al. | 331/10 |
| 6,144,242 A | 11/2000 | Jeong et al. | |
| 6,175,259 B1 | 1/2001 | Mann et al. | |
| 6,294,936 B1 | 9/2001 | Clementi | |
| 6,606,005 B2 * | 8/2003 | Chang | 331/78 |
| 6,736,474 B1 * | 5/2004 | Tiede | 327/536 |
| 2002/0075050 A1* | 6/2002 | Ma | 327/175 |

OTHER PUBLICATIONS

"Charge-Pump Phase-Lock Loops" Floyd M. Gardner IEEE Trans. Comm. vol. COM-28, pp. 1849-1858.

* cited by examiner

*Primary Examiner*—Benny Lee
*Assistant Examiner*—James Goodley

(57) ABSTRACT

Circuit for generating a spread spectrum clock (CGSSC) that employs a mechanism to modulate the input voltage (V_ctrl) to the VCO to achieve dithering. The CGSSC includes a voltage controller oscillator (VCO) that generates an output signal (F_out). The VCO includes an input coupled to a voltage control node for receiving a voltage signal and an output for generating a clock signal that has a frequency dependent on the received voltage signal. A VCO input voltage modulation mechanism (VIVMM) is coupled to the voltage control node (V_ctrl) for modulating or adjusting the voltage at the VCO input voltage node in a controlled manner to generate a spread spectrum clock.

20 Claims, 8 Drawing Sheets

CIRCUIT FOR GENERATING SPREAD SPECTRUM CLOCK

BACKGROUND OF THE INVENTION

Most electronic equipment generates electromagnetic interference (EMI). EMI of one piece of equipment can affect the operation of other equipment in the vicinity of the first equipment. In the United States all electronic equipment must meet rules for electromagnetic emissions set forth by the Federal Communications Commission (FCC). These rules are designed to ensure that EMI from one piece of equipment does not affect other electronic equipment. The FCC rules specify how much energy a piece of electronic equipment may radiate at any particular frequency and at a particular distance.

Digital electronics and digital circuits typically require one or more clock signals, each with its own predetermined frequency. For example, in personal computers (PCs), the system clock signal can have a high frequency, such as 200 MHz. This clock signal is connected to multiple components so that the wire or trace on a circuit board can be relatively long. Since a long wire acts as an antenna, the clock signal can cause the PC to radiate or emit large amounts of energy at the clock frequency and its harmonics. These EMI emissions can make the task of complying with the FCC rules for EMI emissions very difficult if not impossible.

A well-known technique to reduce the peak EMI energy is to spread the spectrum of the clock. Phase-locked loop (PLL) circuits have been used to provide precise clock signals in a variety of applications in electronics.

There are many applications that require frequency synthesis (i.e., modulating the frequency of a signal (e.g., a carrier signal)). There are many ways to achieve spread spectrum, which is also know as dithering. One way to achieve dithering is to use a phase-locked loop (PLL). One prior art approach is illustrated in FIG. 1. FIG. 1 illustrates a prior art phase-locked loop (PLL) design 2. The phase-locked loop (PLL) design 2 includes a voltage-controlled oscillator (VCO) 4, a P-counter 6, a Q-counter 8, a phase detector 10, a charge pump 12, and loop filter 13.

The voltage controller oscillator (VCO) 4 generates a clock signal with a frequency that depends on its input voltage (i.e., the voltage at the V_ctrl node). The VCO includes an output that is coupled to the output node of the phase locked loop and generates an output clock signal (F_out). The input of the VCO 4 is also coupled to the loop filter 13 and the V_ctrl node. When the VCO input voltage changes, the frequency of the output clock signal changes in a linear fashion. For example, when the input voltage increases, the frequency of the output clock signal increases in a linear fashion. Similarly, when the input voltage decreases, the frequency of the output clock signal decreases in a linear fashion.

The P-counter 6 includes an input coupled to the output of the VCO 4. The P-counter has a first register for storing a first P value (e.g., P0) and a second register for storing a second P value (P1). The first P value (P0) and second P value (P1) represent two different integers that can be used to divide down the output frequency (F_out).

The P-counter 6 divides the frequency of the input signal by a predetermined number. For example, the P-counter 6 typically outputs a clock signal that has a feedback frequency (F_fb), which is an integer fraction of the frequency (F_out) of the clock signal generated by the VCO 4. The output (F_fb) of the P-counter 6 is coupled to an input of the phase detector 10.

The Q counter 8 includes an input for receiving an input frequency signal (F_in) and an output for generating a reference frequency (F_ref). The Q-counter 8 typically divides the input frequency (F_in) by a predetermined integer (Q) to generate a corresponding reference frequency (F_ref). For example, the reference frequency (F_ref) is an integer fraction of the input frequency (F_in).

The phase detector 10 includes a first input coupled to the output of the Q counter 8 for receiving the F_ref signal, a second input coupled to the output of the P counter 6 for receiving the F_fb signal, and an output for generating an up control signal and a down control signal. The charge pump 12 is coupled to the phase detector 10 for receiving the up and down control signals and for selectively charging (up) and discharging (down) the voltage control node (V_ctrl node) based on the up and down control signals.

The phase detector 10 compares the reference frequency (F_ref) with the feedback frequency (F_fb) provided by the P-counter 6. When the phase of the two input signals is not the same, the phase detector 10 controls the charge pump 12 to add or remove charge from the loop filter. A publication entitled, "Charge-Pump Phase-Lock Loops" Floyd M. Gardner IEEE Trans. Comm., vol. COM-28, pp 1849–1858, November 1980, further describes the interaction of the phase detector and the loop filter.

The adjustment of the input to the VCO 4 increases the frequency of the clock output of the VCO 4 (speeds up the signal) or decreases the frequency of the clock output of the VCO 4 (slows down the signal). By so doing, the PLL can provide a stable and steady clock output signal with a "locked" frequency.

For the PLL, the output frequency is related to the input frequency by the following expressions:

$F\_out = F\_in * P/Q$, where P and Q are integers that are loaded into the P-counter and Q-counter, respectively.

As described earlier, in order to reduce EMI emissions, spread-spectrum PLLs are important to generate clock signals in digital designs, for example. In dithering or spread spectrum mode, the values loaded in the P-counter alternate or switch between two different values (e.g., P0 and P1). Alternating values of P cause the F_fb to alternate, which causes F_out to vary between a first output frequency and a second output frequency. The rate at which the output frequency varies with respect to time is referred to as the modulation frequency.

A spread-spectrum PLL has a frequency response with respect to time that resembles a triangle wave. Consequently, this approach is also called triangle wave dithering. There are different approaches to implement triangle wave dithering.

A first drawback of this scheme is that setting the output of the P-counter to one of two different frequency values may introduce instability into the loop dynamics of the PLL. For example, the jump between a first frequency and a second frequency can cause the PLL to come "out of lock." A second drawback of this scheme is that this approach causes difficult timing problems, especially at higher frequencies. For example, when the output frequency of the VCO is 1 GHz or greater, it becomes a technical challenge for the P-counter to load in an alternate fashion P0 and P1 in a timely manner.

There are many circuits developed to attempt to solve the timing problems described earlier. Unfortunately, these circuits that are designed to overcome the timing issues often further disturb loop dynamics that may lead to instability in the PLL and "unlocking" of the frequency. Even if these circuits do not lead to instability of the PLL, they often degrade the performance of the PLL.

One approach is described in U.S. Pat. No. 5,610,955 that is directed to a PLL design that modulates the Q-counter with two values Q0 and Q1 to change the input of the VCO and provide dithering. Unfortunately, one disadvantage of this approach is that the design can introduce instability into the loop dynamics, thereby causing the loop to go out of lock. For example, instability can be introduced into the loop dynamics by changing the phase of reference frequency (F_ref).

An attempt to solve the timing issues related to the use of two frequency values in the p-counter involves complex analog circuits to implement special p-counter divider circuits. Unfortunately, one disadvantage of this approach is that it requires a high level of design skill of an analog design specialist, who may be difficult to locate. Furthermore, this approach typically realizes circuits, whose performance depends on the manufacturing process employed. Consequently, when a new manufacturer is selected to make the circuit, these circuits may require to be re-designed, thereby wasting resources.

Based on the foregoing, there remains a need for a circuit that provides dithering that overcomes the disadvantages set forth previously.

SUMMARY OF THE INVENTION

According to one embodiment of the present invention, a circuit for generating a spread spectrum clock (CGSSC) that employs a mechanism to modulate the input voltage (V_ctrl) to the VCO to achieve dithering. The CGSSC includes a voltage controller oscillator (VCO) that generates an output signal (F_out). The VCO includes an input coupled to a voltage control node for receiving a voltage signal and an output for generating a clock signal that has a frequency dependent on the received voltage signal. A VCO input voltage modulation mechanism (VIVMM) is coupled to the voltage control node (V_ctrl) for modulating or adjusting the voltage at the VCO input voltage node in a controlled manner to generate a spread spectrum clock.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

A circuit for generating a spread spectrum clock (CGSSC) that employs a mechanism to modulate the VCO input voltage in order to achieve dithering is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Circuit for Generating a Spread Spectrum Clock 200

Figure 1:
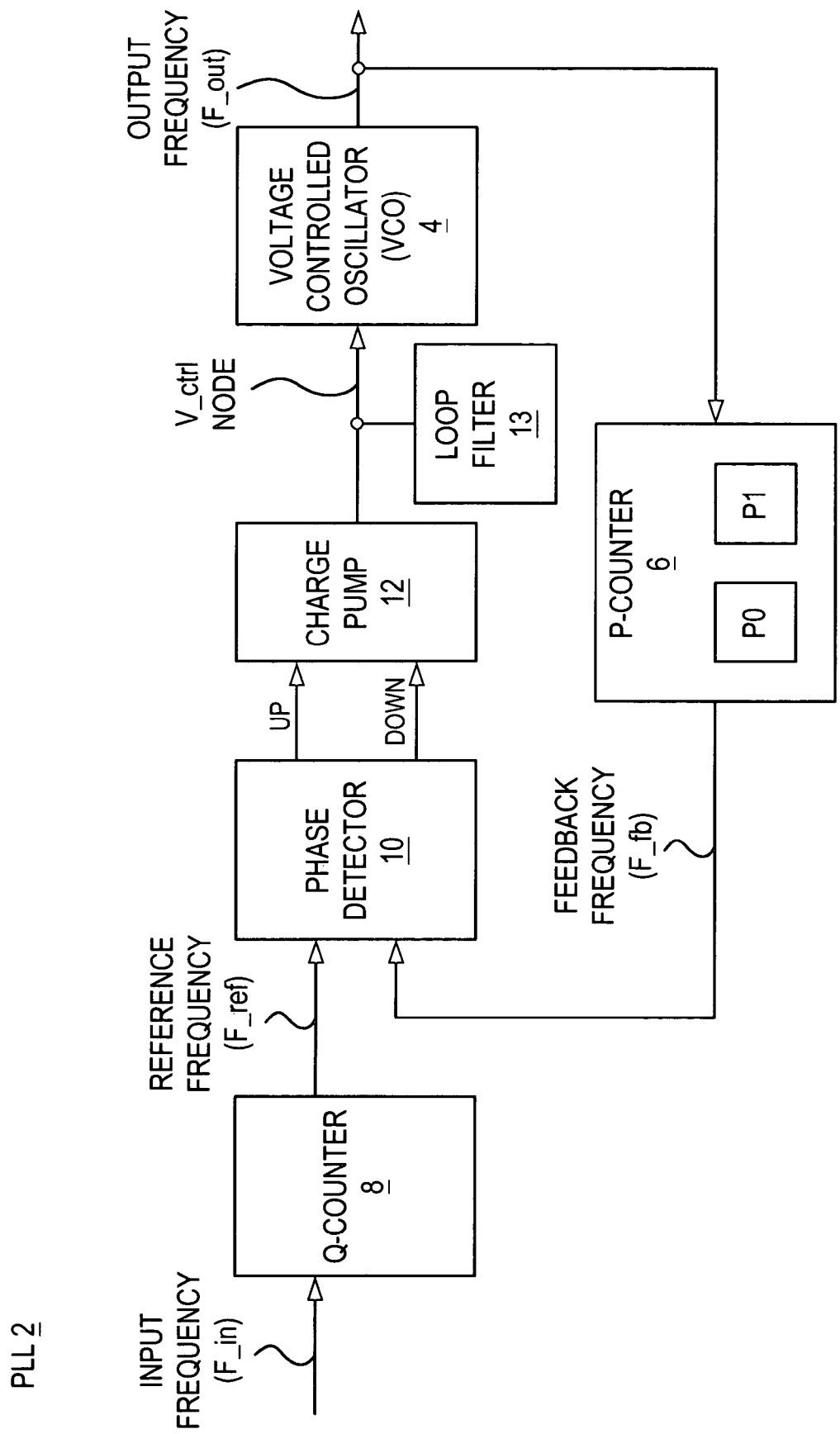
FIG. 1 illustrates a prior art phase-locked loop (PLL) design.
Figure 2:
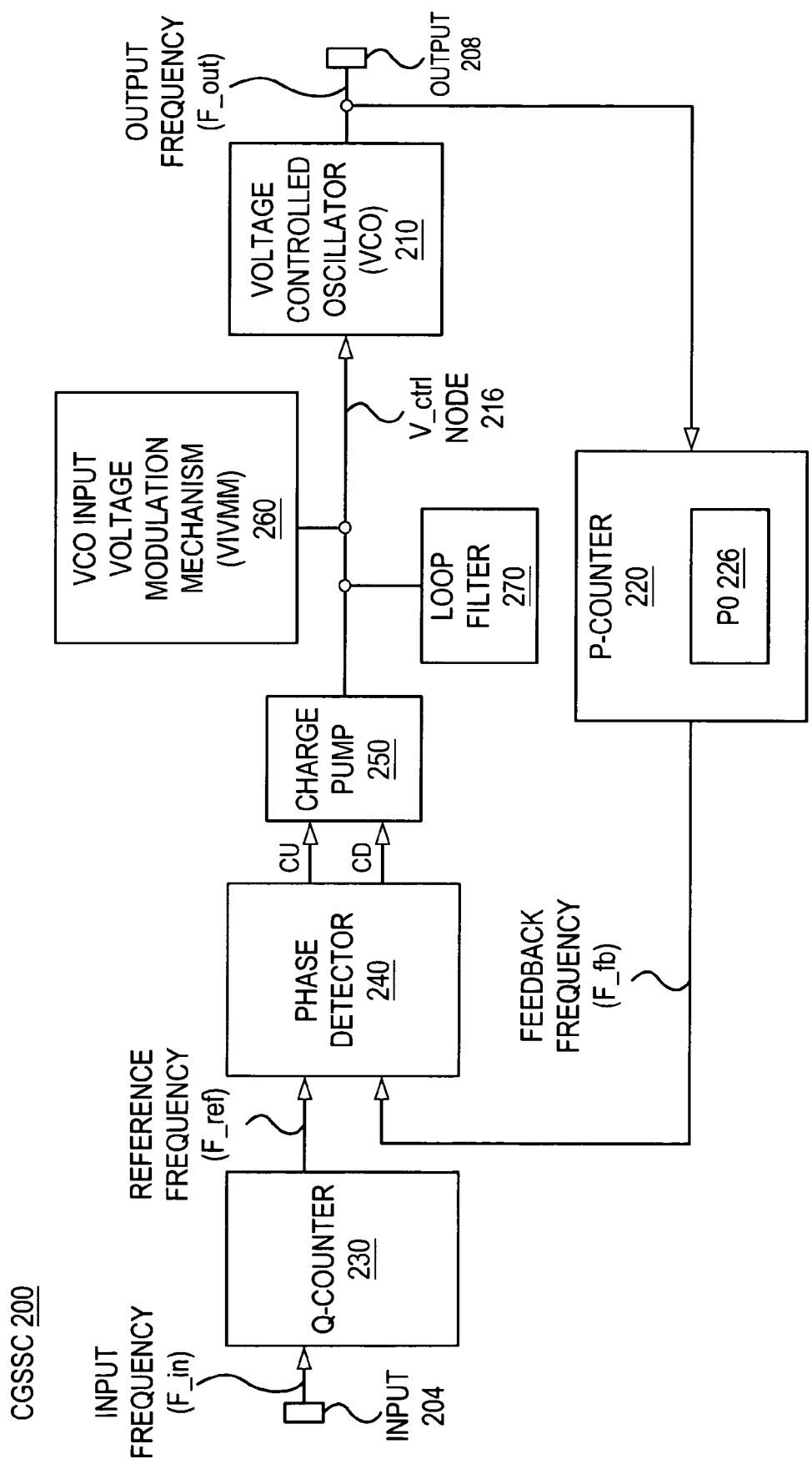
FIG. 2 illustrates a block diagram of a circuit for generating a spread spectrum clock (CGSSC) according to one embodiment of the invention.

FIG. 2 illustrates a circuit for generating a spread spectrum clock (CGSSC) 200 according to one embodiment of the invention. In this embodiment, the spread spectrum clock (CGSSC) 200 is implemented as a phase-locked loop (PLL). The CGSSC 200 has an input node 204 and an output node 208. The CGSSC 200 includes a voltage controller oscillator (VCO) 210 that includes an input coupled to a voltage control node (V_ctrl node) 216 for receiving a voltage signal and an output for generating an output signal with an output frequency (F_out). The output signal or clock signal (F_out) has a frequency that is dependent on the received voltage signal. The output of the VCO 210 is coupled to the output node 208 of the CGSSC 200 and provides the output clock signal (F_out).

The CGSSC 200 also includes a P-counter 220 that includes an input coupled to the output of the VCO 210. The P-counter 220 includes a register 226 for storing a single P value (e.g., P0), and an output for providing a clock signal that has a frequency (also referred to as "feedback frequency" (F_fb)), which is a fraction of the frequency of the clock signal generated by the VCO 210.

The CGSSC 200 also includes a Q-counter 230 that includes an input for receiving an input clock signal with an input frequency (F_in) and an output for generating a clock signal with a reference frequency (F_ref). The CGSSC 200 also includes a phase detector (PD) 240 that includes a first input that is coupled to the output of the Q-counter 230 and a second input that is coupled to the output of the P-counter 220 and outputs for generating control signals (e.g., a control_up (CU) signal and a control_down (CD) signal).

For example, when the edges of the input signals (F_ref and F_fb) coincide, the PLL is in lock, and the phase detector 240 does not perform any action. However, when the PLL is out of lock, the phase detector 240 either asserts the control_up (CU) signal or the control_down (CD) signal, depending on whether the edge of the first signal leads or lags the other signal in phase. In this manner, the PLL can adjust its output (F_out) to match the reference frequency (F_ref) so that the PLL can operate in a lock manner.

The CGSSC 200 also includes a charge pump (CP) 250 that is coupled to the phase detector 240 for receiving the control signal and selectively charging and discharging the voltage control node based on the control signal.

The CGSSC 200 also includes a VCO input voltage modulation mechanism (VIVMM) 260 that is coupled to the voltage control node (V_ctrl node) 216 for modulating the VCO input voltage to achieve dithering. Specifically, the VIVMM 260 modulates, adjusts, changes, varies, or modifies (e.g., increases or decreases) the voltage at the voltage control node (V_ctrl node) 216 in a manner that is programmable by a designer to provide dithering. As described in greater detail hereinafter with reference to FIG. 3, the voltage at the voltage control node (V_ctrl node) 216 can be modulated by either drawing a voltage level shifting current from the V_ctrl node 216 or injecting a voltage level shifting current into the V_ctrl node 216. The VIVMM 260 is described in greater detail hereinafter with reference to FIGS. 3–5.

The CGSSC 200 includes a loop filter 270. The loop filter 270 can include one or more capacitors in parallel with a capacitor in series with one or more resistors. The construction and operation of loop filters are known by those of ordinary skill in the art and thus, not described in greater detail herein.

VCO Input Voltage Modulation Mechanism (VIVMM)

Figure 3:
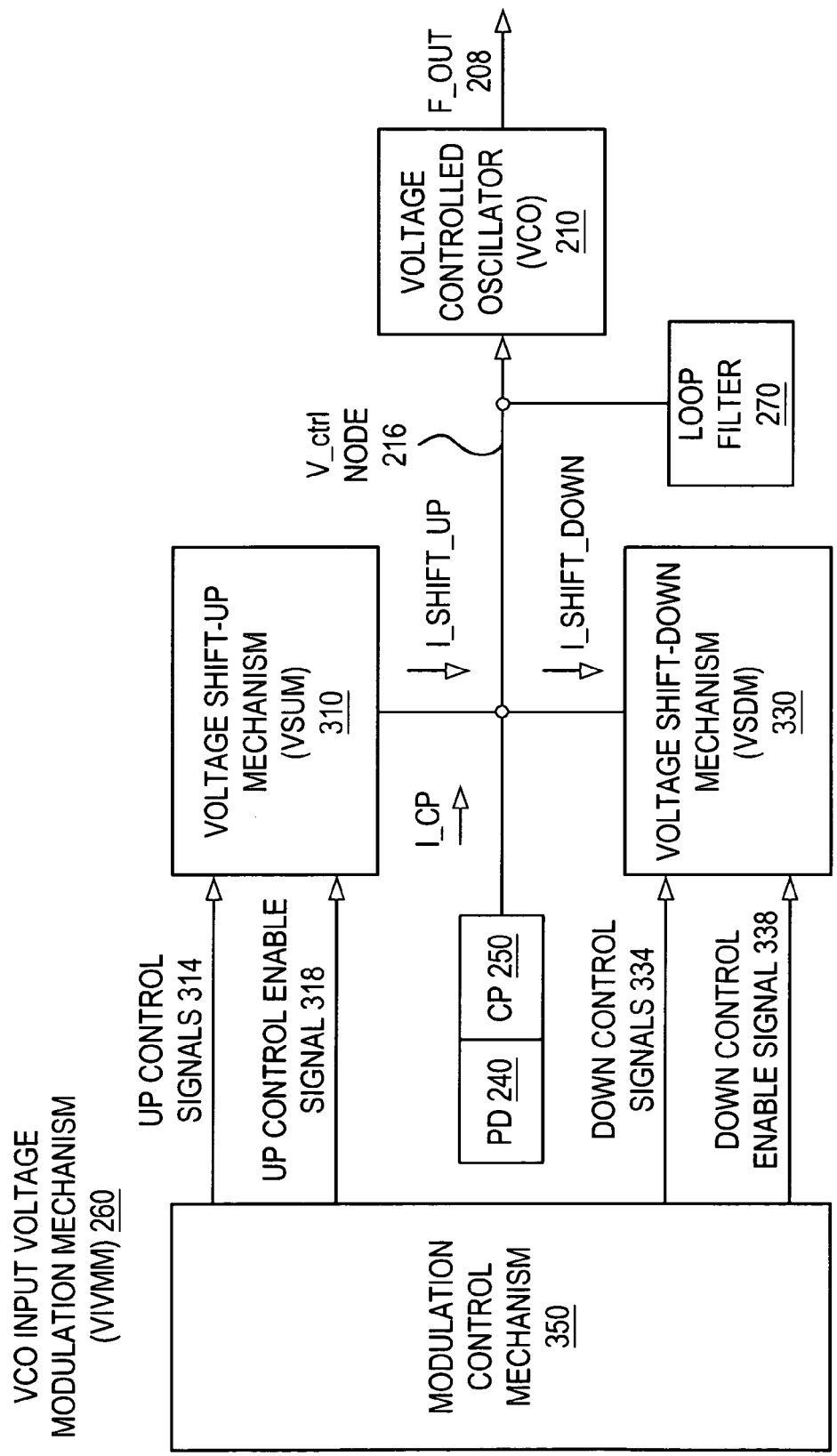
FIG. 3 illustrates in greater detail the VCO input voltage modulation mechanism of FIG. 2 according to one embodiment of the present invention.

FIG. 3 illustrates in greater detail the VCO input voltage modulation mechanism (VIVMM) 260 of FIG. 2 according to one embodiment of the present invention. As described previously, one manner in which the VIVMM 260 can modulate the voltage at the V_ctrl node 216 is by charging (e.g., by injecting current into the node) the node or by discharging (e.g., by drawing current from the node) from the node. FIG. 3 illustrates that the loop filter 270 and charge pump (CP) 250 are coupled to the V_ctrl node 216. The phase detection (PD) 240 is also shown in FIG. 3.

The VIVMM 260 includes a voltage shift-up mechanism (VSUM) 310 for injecting a level shifting current (e.g., I_shift_up) into the V_ctrl node 216 and voltage shift-down mechanism (VSDM) 330 for drawing a level shifting current (e.g., I_shift_down) from the V_ctrl node 216.

The voltage shift-up mechanism 310 includes at least one input for receiving an up control signal 314 and an input for receiving an up control enable signal 318. Based on these input signals, the voltage shift-up mechanism 310 generates a shift-up current (e.g., I_shift_up) for increasing the voltage at V_ctrl node 216 (e.g., by charging the loop filter capacitances at the V_ctrl node 216). In an exemplary implementation described in greater detail hereinafter with reference to FIG. 4, voltage shift-up mechanism 310 includes a plurality of inputs for receiving a plurality of up-control signals 314.

The voltage shift-down mechanism 330 includes at least one input for receiving a down-control signal 334 and an input for receiving a down-control enable signal 338. Based on these input signals, the voltage shift-down mechanism 330 generates a shift-down current (e.g., I_shift_down) for decreasing the voltage at the V_ctrl node 216 (e.g., by discharging the capacitances at the V_ctrl node 216). In an exemplary implementation described in greater detail hereinafter with reference to FIG. 4, voltage shift-down mechanism 330 includes a plurality of inputs for receiving a plurality of down-control signals 334.

The VIVMM 260 also includes a modulation control circuit (MCC) 350 for generating a plurality of digital signals for use in controlling the voltage shift-up mechanism (VSUM) 310 and the voltage shift-down mechanism (VSDM) 330. For example, the modulation control circuit (MCC) 350 generates a plurality of digital signals (e.g., up-control signals 314, an up-control enable signal 318, down-control signals 334, and a down-control enable signal 338). An exemplary implementation of the modulation control mechanism 350 is described in greater detail hereinafter with reference to FIG. 5.

It is noted that the modulation control circuit 350, voltage shift-up mechanism 310, and voltage shift-down mechanism 330 according to the invention can be implemented in a variety of ways and by employing various circuits. In one embodiment, which is described in greater detail hereinafter with reference to FIG. 4, the voltage shift-up mechanism 310 and voltage shift-down mechanism 330 according to the invention are implemented with transistors (e.g. P-type and N-type transistors), and the modulation control circuit 350 is implemented with a digital controller.

Exemplary Circuit Implementation of the VCO Input Voltage Modulation Mechanism

Figure 4:
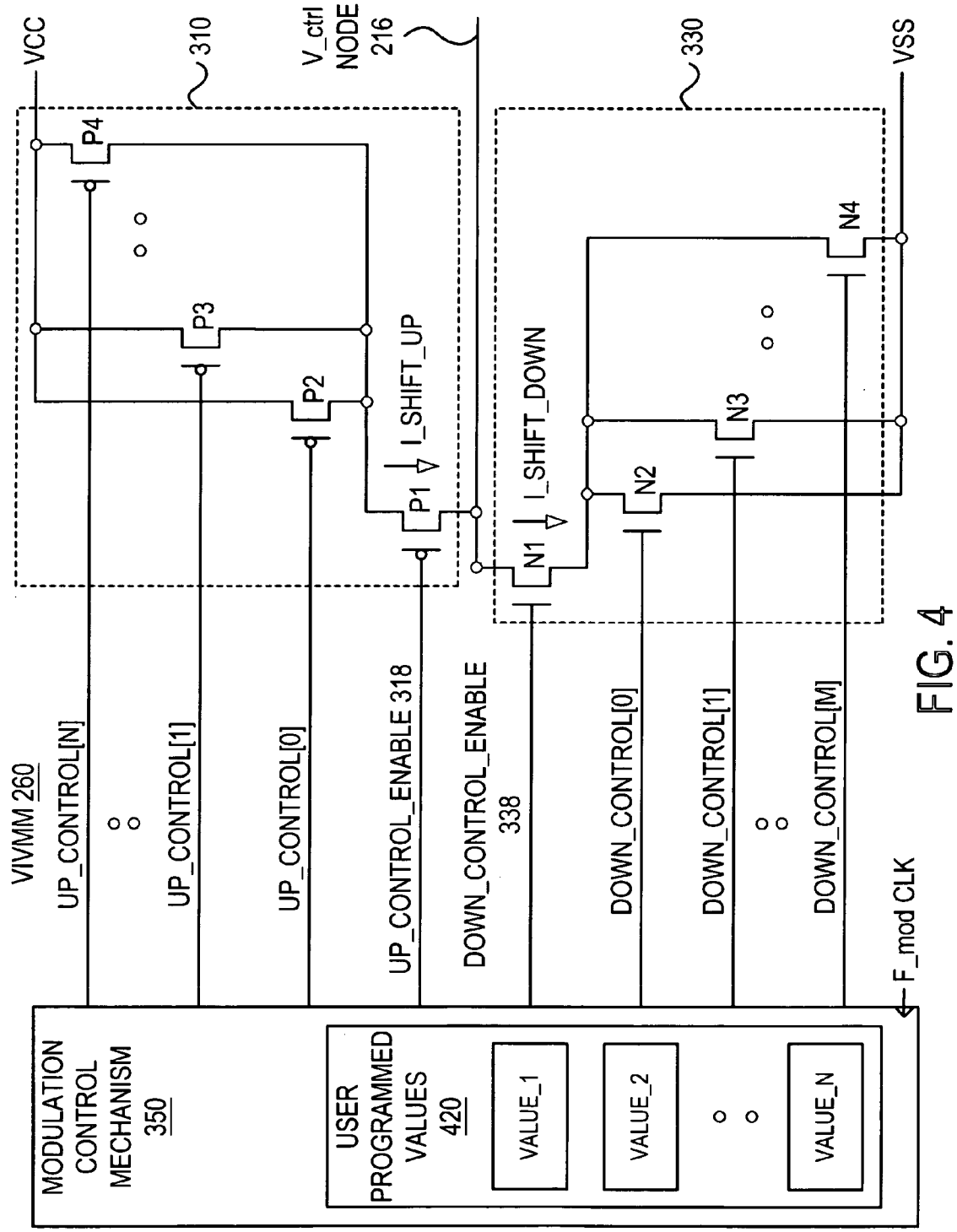
FIG. 4 illustrates an exemplary circuit implementation of the VCO input voltage modulation mechanism of FIG. 3 according to one embodiment of the present invention.

FIG. 4 illustrates an exemplary circuit implementation of the VCO input voltage modulation mechanism (VIVMM) 260 of FIG. 2 according to one embodiment of the present invention. The voltage shift-up mechanism 310 includes an up-control enable transistor (e.g., transistor P1) and one or more pull-up transistors (e.g., transistors P2 to P4) for generating the I_shift_up signal.

The up-control enable transistor (e.g., transistor P1) includes a first electrode (e.g., a drain electrode) for coupling to an electrode of pull-up transistors P2, P3, P4, etc., a second electrode (e.g., a source electrode) that is coupled to the V_ctrl node 216, and a third electrode (e.g., a gate electrode) for receiving a shift-up control enable signal (e.g., UP_CONTROL_ENABLE 318).

The pull-up transistors each include a first electrode (e.g., a drain electrode) that is coupled to a first predetermined voltage (e.g., VCC), a second electrode (e.g., source electrode) coupled to the first electrode of the enable transistor, and a third electrode (e.g., a gate electrode) for receiving a respective shift-up control signal (e.g., UP_CONTROL [0 . . . N]). In one embodiment, the voltage shift-up mechanism 310 can utilize a single pull-up transistor (e.g., transistor P2). However, it is noted that the voltage shift-up mechanism 310 can include a plurality of pull-up transistors (e.g., transistors P2, P3, etc.) that are coupled in parallel to each other as shown. In this embodiment, each of these pull-up transistors can include a drain electrode that is coupled to the first predetermined voltage (e.g., $V_{CC}$), a source electrode that is coupled to the drain electrode of the up-control enable transistor (P1), and a gate electrode for receiving a corresponding shift-up control signal (e.g. UP_CONTROL[0 . . . N]).

The voltage shift-down mechanism 330 includes a down-control enable transistor (e.g., transistor N1) and one or more pull-down transistors (e.g., transistors N2 to N4) for generating the I_shift_down signal.

The down-control enable transistor (e.g., transistor N1) includes a first electrode (e.g., a drain electrode) coupled to the V_ctrl node 216, a second electrode (e.g., a source electrode) that is coupled to an electrode of the pull-down transistors (e.g., transistors N2 to N4), and a third electrode (e.g., a gate electrode) for receiving a shift-down control enable signal (e.g., DOWN_CONTROL_ENABLE 338).

The pull-down transistors each include a first electrode (e.g., a drain electrode) that is coupled to the second electrode of the down-control enable transistor (transistor N1), a second electrode (e.g., source electrode) coupled to a second predetermined voltage ($V_{SS}$), and a third electrode (e.g., a gate electrode) for receiving a respective shift-down control signal (e.g., DOWN_CONTROL[0 . . . M]). In one embodiment, the voltage shift-down mechanism 330 can utilize a single pull-down transistor (e.g., transistor N2).

However, it is noted that the voltage shift-down mechanism 330 can include a plurality of transistors (e.g., transistors N2, N3, N4 etc.) that are coupled in parallel to each other as shown. In this embodiment, each of these pull-down transistors can include a drain electrode coupled to the source electrode of the down-control enable transistor (transistor N1), a source electrode coupled to a second predetermined voltage ($V_{SS}$), and a gate electrode for receiving a respective shift-down control signal (e.g., DOWN_CONTROL[0 . . . M]).

The voltage shifting mechanisms 310, 330 according to the invention add or subtract a predetermined amount of charge to the loop filter 270 that is connected to the V_ctrl node 216. The loop filter 270 converts a change in current to a corresponding change in voltage. In other words, the level shifting mechanisms 310, 330 modulate the input voltage of the VCO 210 by a predetermined voltage (e.g., a designer-controlled or programmed voltage) to achieve dithering. The amount of voltage change or modulation can be set or programmed by the designer to suit the requirements of a particular application.

Figure 8:
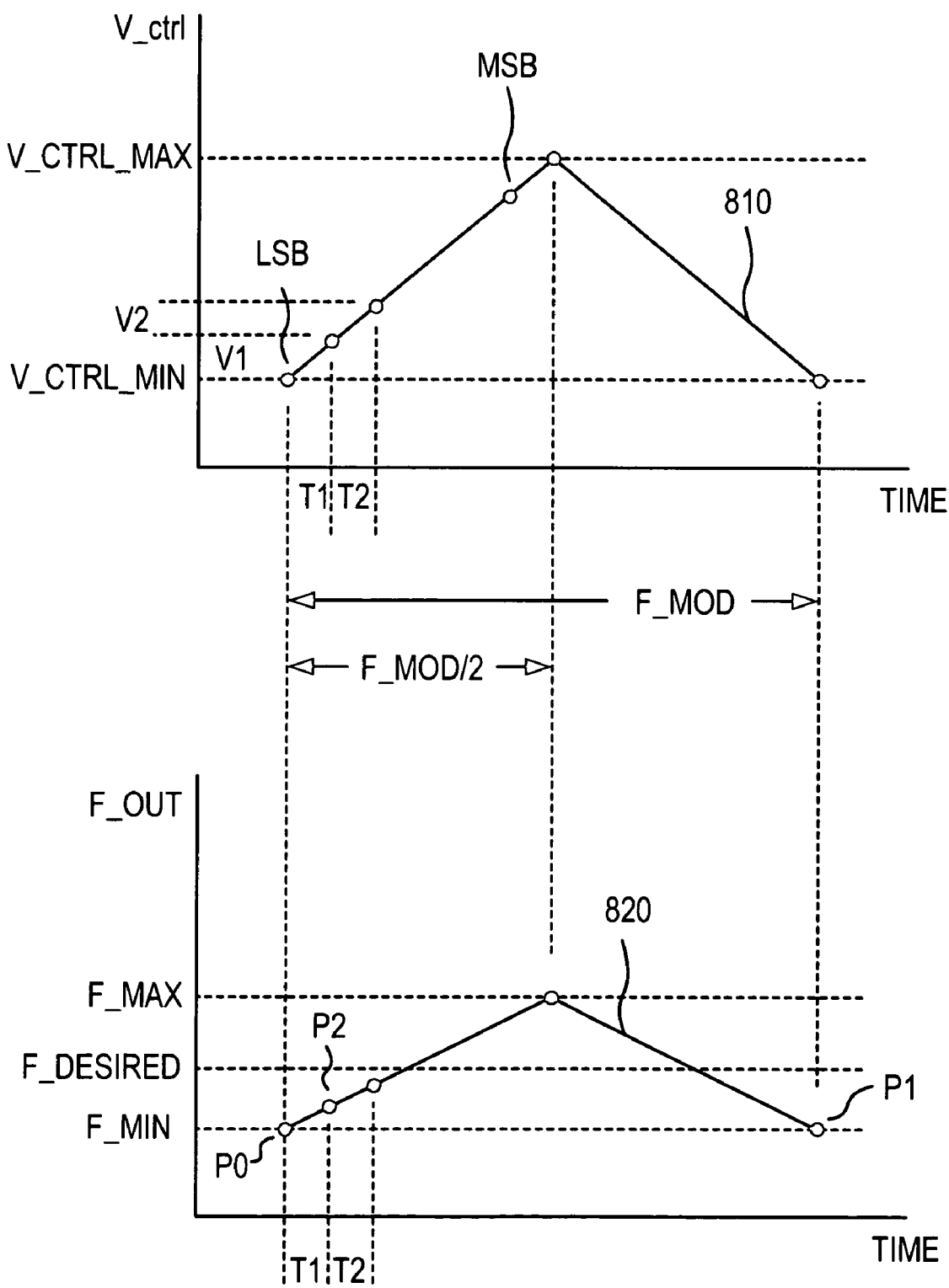
FIG. 8 illustrates exemplary waveforms related to the circuit for generating a spread spectrum clock (CGSSC) of FIG. 2.

Since the modulation control circuit 350 can be programmed to specify the change in voltage at the V_ctrl node 216 with respect to time, the configuration parameters 420 provided to the modulation control circuit 350 can control or specify the slope of the different portions of the waveforms (810 and 820) illustrated in FIG. 8.

The characterization of a VCO 210 (i.e., the F_out versus time waveform) may have a positive slope or a negative slope as described in greater detail hereinafter with reference to FIG. 6 and FIG. 7, respectively. A designer can employ the VCO characterization to determine the configuration parameters and values 420 for the modulation control circuit 350 to generate the appropriate control signals (e.g., signals 314, 318, 334, 338). For example, a designer can program or set the operating characteristics of the voltage shifting mechanisms 310, 330 in order to match the VCO characteristics, such as points on the waveforms 810 and 820 of FIG. 8. The configuration parameters 420 may be stored in registers in the MCM 350.

Once configured, the modulation control circuit 350 selectively modulates the voltage at the VCO input voltage node (i.e., the input of the VCO) so that the output frequency of the CGSSC 200 modulates between points P0 and P1 in the predetermined time period (F_mod) as illustrated in FIG. 8.

One advantage of the modulation control circuit 350 is that the modulation control circuit 350 can be implemented as a digital controller and that the digital control can be utilized to control an analog circuit (i.e., the PLL circuit).

Modulation Control Mechanism (MCM) 350

Figure 5:
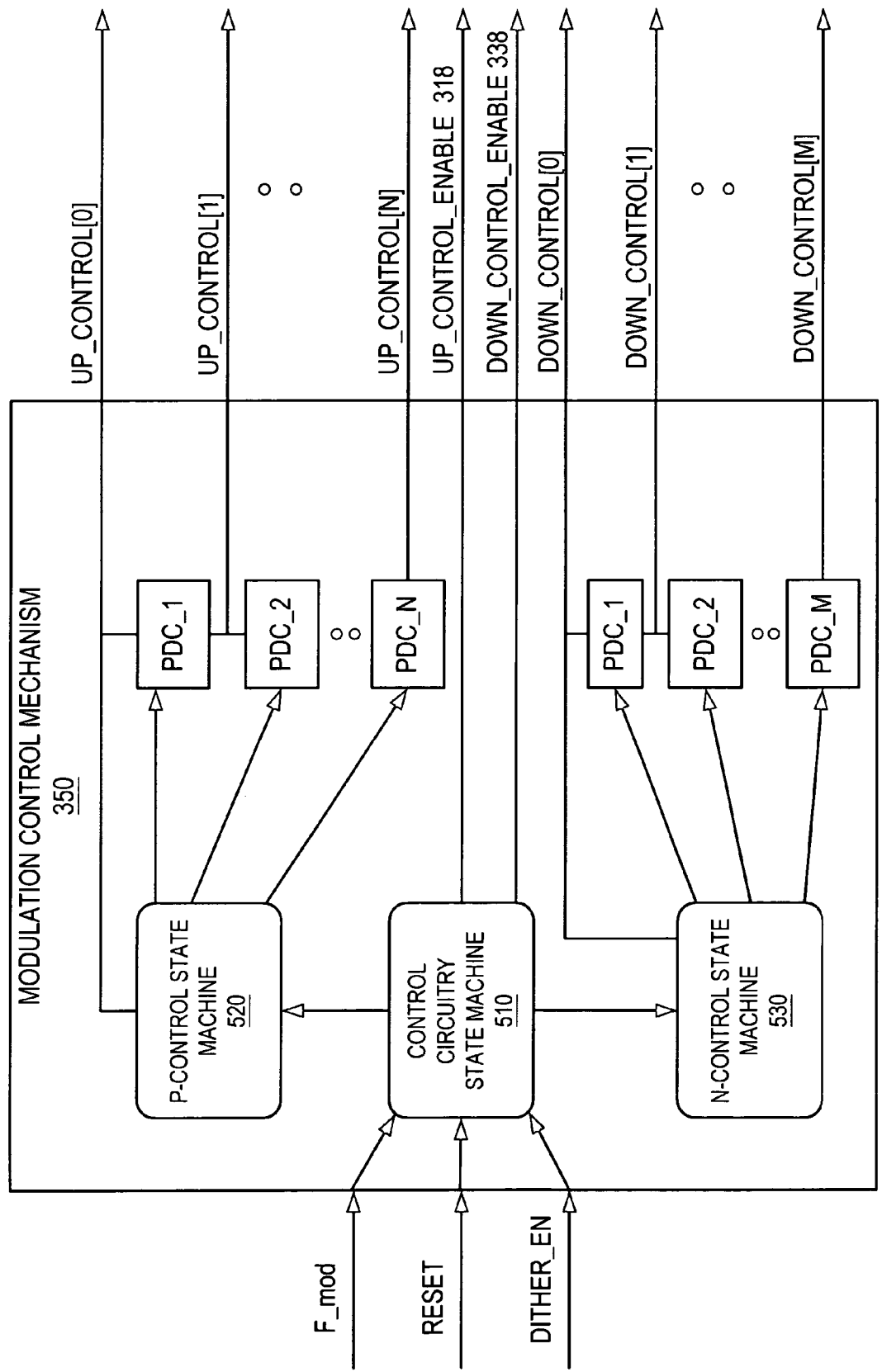
FIG. 5 illustrates in greater detail the modulation control mechanism of FIG. 4 according to one embodiment of the present invention.

FIG. 5 illustrates in greater detail an exemplary implementation of the modulation control mechanism (MCM) 350. The MCM 350 includes a control circuitry state machine 510, a P-control state machine 520, and a N-control state machine 530 for achieving a linear control dither step that ultimately results in a triangle wave dithering. The graph of the V_ctrl versus time profile and the F_out versus time profile generated by MCM 350 are illustrated in FIG. 8.

The control circuitry state machine 510 receives a clock signal (e.g., F_mod CLK) with a modulation frequency (F_mod), a global reset signal (RESET), and a dither enable signal (Dither_en). Based on these inputs, the control circuitry state machine 510 selectively generates the up control enable signal (UP_CONTROL_ENABLE) 318 and the down control enable signal (DOWN_CONTROL_ENABLE) 338 described previously and also selectively enables the P-control state machine 520 and the N-control state machine 530.

The CGSSC according to the invention has two modes: 1) a fixed frequency mode and 2) a dithering or spread spectrum mode. In the fixed frequency mode, F_out has a single frequency (F_desired, illustrated in FIG. 8). In the dithering or spread spectrum mode, F_out varies or changes between two different frequencies.

For example, based on the state of the dither enable signal (Dither_en), the control circuitry state machine 510 generates the up control enable signal (UP_CONTROL_ENABLE) 318 and the down control enable signal (DOWN_CONTROL_ENABLE) 338. When dither or spread spectrum mode is desired, the dither enable signal is asserted. An asserted dither enable signal causes the control circuitry state machine 510 to assert the up control enable signal (UP_CONTROL_ENABLE) 318 and the down control enable signal (DOWN_CONTROL_ENABLE) 338.

The P-control state machine 520 employs a plurality of programmable delay cells (PDCs) to generate the control signals for the P-type transistors (e.g, UP_CONTROL [0 . . . N]). Similarly, the N-control state machine 530 employs a plurality of programmable delay cells (PDCs) to generate the control signals for the N-type transistors (e.g, DOWN_CONTROL[0 . . . M]).

The time delay or time increment of each PDC (e.g., T1 or T2) can be determined by an expression that is based on the modulation frequency (F_mod) and the number of modulation bits (#_modulation_bits). For example, in one embodiment, the time delay or time increment (delta(t)) can be determined by the following expression: delta(t)= (F_mod/2)/(#_modulation_bits). In another embodiment, the time delay or time increment (delta(t)) can be determined by the following expression: delta(t)=(F_mod)/(#_modulation_bits). It is noted that other expressions that include F_mod and the number of modulation bits can be utilized to determine delta(t) in order to suit the requirements of a particular of application.

In this embodiment, the modulation bits are the up control signals and the down control signals (e.g, UP_CONTROL [0 . . . N] and DOWN_CONTROL[0 . . . M]). Preferably, stability considerations for the PLL and the VCO characterization are also evaluated in determining the time increments (e.g., T1 and T2).

It is noted that the P-type transistors and the N-type transistors illustrated in FIG. 4 are sized to account for capacitance loading of the loop filter 270. Specifically, the width and length (e.g., W/L) of the transistors can be determined by employing the following expression:

delta(V_ctrl)=I_N,P*Z_load, where Z is the impedance seen on V_ctrl node 216.

The modulation control mechanism 350 is not limited to a state machine design and implementation. For example, the modulation control mechanism 350 can be designed and implemented as a digital signal processor that accomplishes the functions described herein. Furthermore, the delay cells can either be implemented as software (e.g., a program executed by a central processing unit (CPU)) or hardware (e.g., a physical circuit, standard logic circuits, custom logic circuits, or as an application specific integrated circuit (ASIC)).

FIG. 8 illustrates exemplary waveforms related to the circuit for generating a spread spectrum clock (CGSSC) 200 of FIG. 2. The top graph illustrates a V_ctrl versus time waveform or profile 810, and the bottom graph illustrates an F_out versus time waveform or profile 820. The V_ctrl versus time profile 810 is linear. Similarly, the F_out versus time profile 820 is also linear (e.g., corresponding to linear control steps). However, it is noted that the V_ctrl versus time profile 810 and the F_out versus time profile 820 can both vary in a non-linear fashion.

In this embodiment, the circuit for generating a spread spectrum clock (CGSSC) 200 according to the invention generates an output clock signal (F_out) that has a triangle wave. It is noted that the circuit for generating a spread spectrum clock (CGSSC) 200 according to the invention can be utilized to generate other waveforms with different shapes and profiles.

The waveforms 810 and 820 indicate that F_out varies directly with V_ctrl (i.e., as V_ctrl increases, F_out increases) for this embodiment of the CGSSC according to the invention. However, it is noted that the design of the CGSSC according to the invention can be extended to designs in which F_out varies inversely with V_ctrl. Furthermore, the design of the CGSSC according to the invention is not limited to a linear F_out versus V_ctrl profile illustrated in FIG. 6 and FIG. 7. In other words, the F_out versus V_ctrl profile can vary in a non-linear fashion as controlled by the modulation control mechanism 350.

FIG. 8 also illustrates various parameters that may be determined or programmed by the designer of the CGSSC 200. For example, the bottom graph illustrates along the frequency axis the following parameters: a maximum frequency (F_max), a minimum frequency (F_min), and a predetermined desired average frequency (F_desired). A first point and a second point are also shown on the graph. Also, T1 denotes the time between the first point P0 and the second point P2. These parameters may be determined by utilizing the characterization of the VCO 210. Exemplary VCO characterizations are described in greater detail hereinafter with reference to FIGS. 6 and 7.

The modulation control circuit 350 can be programmed to specify parameters, such as a maximum frequency (F_max), a minimum frequency (F_min), and a predetermined desired average frequency (F_desired), which is equal to F_in*P/Q.

Specifically, the modulation control circuit 350 may be configured or programmed with configuration parameters in order to set the time (e.g., T1 and T2) between points along the waveforms 810, 820 and the voltage (e.g., V1 and V2) between points along the V_ctrl versus time waveform or profile 810. For example, the programmable delay cell (PDC) of FIG. 5 can be programmed to specify the change in time between points (e.g., T1, T2). Also, the up control signals 314 and down control signals 334 can be utilized to control the change in voltage (V1, V2) between points on waveform 810. It is noted that the change in time between adjacent points may be uniform (e.g., the same increment) or non-uniform (e.g., a different increment). It is further noted that the change in voltage between adjacent points may be uniform (e.g., the same increment) or non-uniform (e.g., a different increment).

By controlling both the time between points and the voltage difference between points, the modulation control circuit 350 according to the invention spreads out the frequency of the output clock (F_out), thereby causing a reduction of EMI.

Exemplary VCO Characterizations

Figure 6:
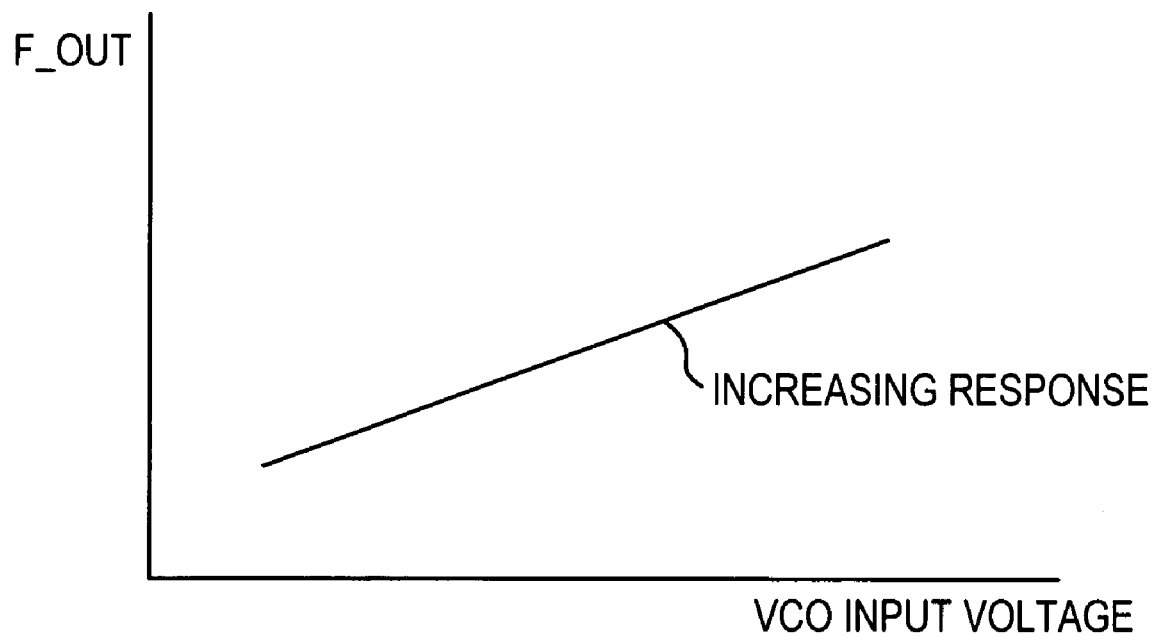
FIG. 6 illustrates a first exemplary VCO characterization of the VCO of FIG. 1 according to one embodiment of the invention.

FIG. 6 illustrates a first exemplary VCO characterization of the VCO 210 according to one embodiment of the invention. FIG. 6 is an output frequency (F_out) versus VCO input voltage (V_ctrl) graph. In this embodiment, the characterization of the VCO has an increasing frequency response with respect to increasing voltage at the V_ctrl node 216.

Figure 7:
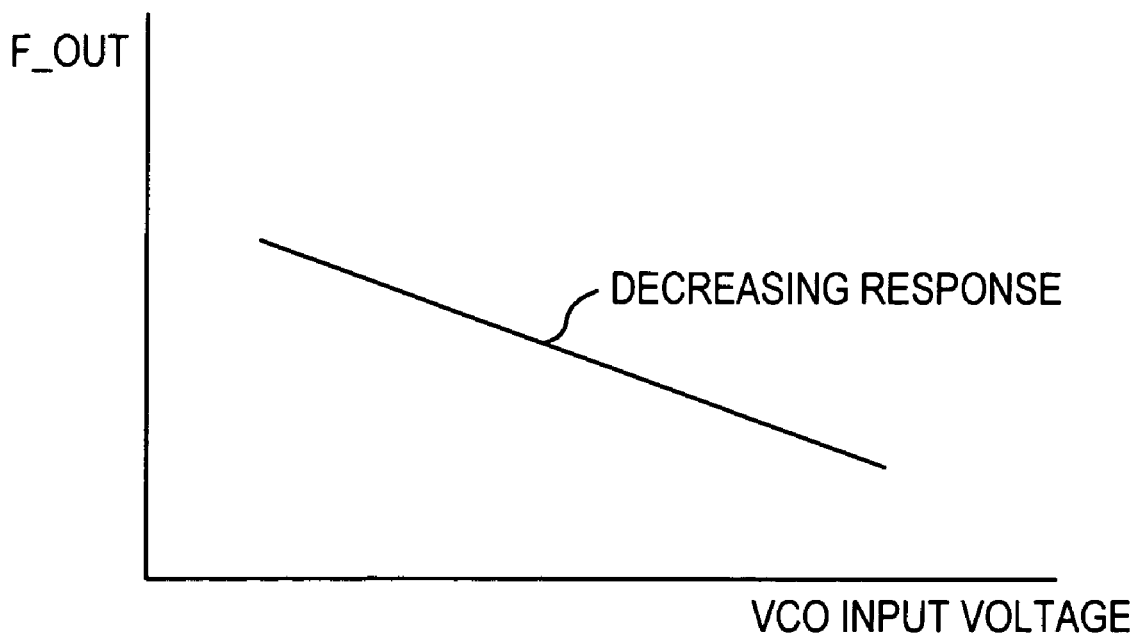
FIG. 7 illustrates a second exemplary VCO characterization of the VCO of FIG. 1 according to one embodiment of the invention.

FIG. 7 illustrates a second exemplary VCO characterization of the VCO 210 according to one embodiment of the invention. FIG. 7 is an output frequency (F_out) versus VCO input voltage (V_ctrl) graph. In this embodiment, the characterization of the VCO has a decreasing frequency response with respect to increasing voltage at the V_ctrl node 216. The VIVMM 260 according to the invention operates not only for VCOs with characterizations illustrated in FIG. 6 FIG. 7, but also with other VCO characterizations (e.g., non-linear F_out versus V_ctrl waveforms).

Processing Steps

The VIVMM 260 according to the invention provides dithering. Specifically, the dithering circuit and method according to the invention employs or utilizes modulation of the voltage at the V_ctrl node 216 (i.e., the input voltage of the VCO 210) to provide dithering.

Figure 9:
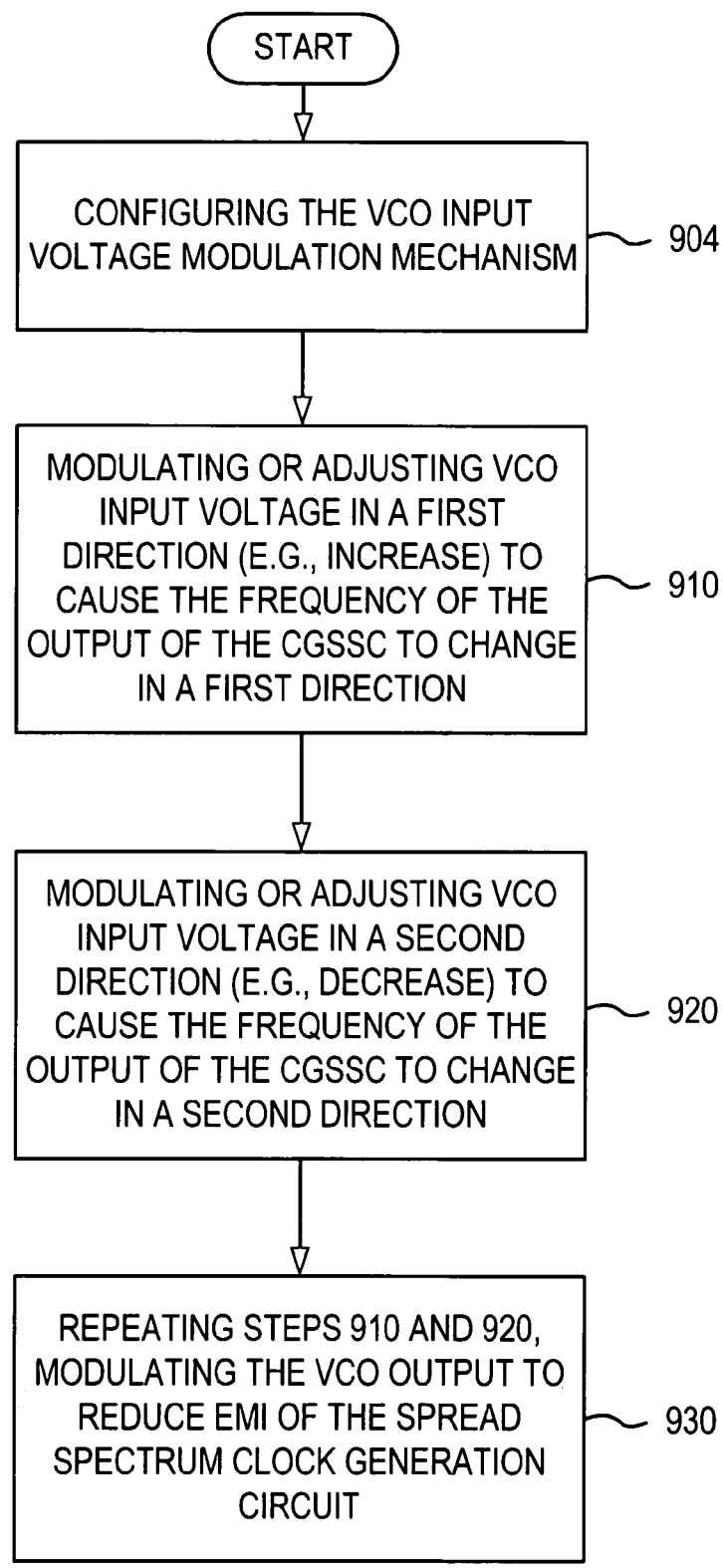
FIG. 9 illustrates a flowchart of the processing steps performed by the VCO input voltage modulation mechanism according to one embodiment of the invention.

FIG. 9 illustrates a flowchart of the processing steps performed by the VCO input voltage modulation mechanism according to one embodiment of the invention. In step 904, the VCO input voltage modulation mechanism (VIVMM 260) is configured. This step can involve the following: 1) characterizing the VCO 210, and 2) configuring or programming the parameters for the modulation control circuit 350. (e.g., F_max, F_min, F_desired, time between points and voltage between points P1 and P2, etc.)

In step 910, the VCO input voltage (i.e., the voltage at the V_ctrl node) is modulated or adjusted in a first direction (e.g., increased) to cause the frequency of the output (F_out) of the CGSSC 200 to change in a first direction. Step 910 can include the step of injecting a voltage level shifting current into the V_ctrl node 216.

In step 920, the VCO input voltage (i.e., the voltage at the V_ctrl node) is modulated or adjusted in a second direction (e.g., decreased) to cause the frequency of the output (F_out) of the CGSSC 200 to change in a second direction. Step 920 can include the step drawing a voltage level shifting current from the VCO input voltage node.

In step 930, repeating steps 910 and 920 to modulate the VCO output to reduce EMI of the clock signal generation circuit. For example, the VCO output may be modulated in either a linear fashion or a non-linear fashion to reduce EMI of the clock signal generation circuit. The modulation control method and programming according to the invention allows EMI to be reduced by controlling variables, such as V1, V2, T1 and T2 of FIG. 8.

According to the present invention, the frequencies of the output signal from the CGSSC 200 can be precisely controlled. Furthermore, the rate at which the frequency changes can also be controlled without the disadvantages of the prior art approaches.

The VCO input voltage modulation mechanism according to the invention is useful for applications where dithering is required. For example, these applications include, but are not limited to, personal computers (PCs), portable computing devices (e.g., laptop computers and personal digital assistants (PDAs)), computer peripherals, office equipment (e.g., printers, copiers, facsimile machines, etc.), network equipment, and other electronic applications, where EMI reduction is desired.

Although the VCO input voltage modulation mechanisms of the invention has been described by the various embodiments shown in FIGS. 2–9, other arrangements can be devised in accordance with the teachings of the invention to realize other circuits that employ VCO input voltage modulation mechanism according to the invention to achieve dithering.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A circuit for generating a spread spectrum clock comprising:
    an output node;
    a voltage controller oscillator (VCO) that includes an input coupled to a voltage control node (V_ctrl) for receiving a voltage signal and an output for generating a clock signal that has a frequency (F _out) dependent on the received voltage signal; and
    a VCO input voltage modulation mechanism, coupled to the VCO input voltage node, for modulating a voltage at the VCO input voltage node to generate a spread spectrum clock; wherein the VCO input voltage modulation mechanism uses a plurality of pull-up transistors and a plurality of pull-down transistors to selectively adjust the voltage at the VCO input voltage node; and wherein the VCO input voltage modulation mechanism uses a plurality of delay cells to selectively adjust the time between a first point and a second point on a graph of the voltage at the VCO input voltage node with respect to time.

2. The circuit of claim 1 wherein the VCO input voltage modulation mechanism further includes
    a voltage shift-up mechanism for pulling up the voltage at the VCO input voltage node by injecting a level shifting current into the VCO input voltage node.

3. The circuit of claim 2 wherein the VCO input voltage modulation mechanism further includes
    a modulation control circuit for generating a shift-up control enable signal and at least one shift-up control signal for use in controlling the voltage shift-up mechanism;
    wherein the voltage shift-up mechanism includes a first input for receiving the shift-up control enable signal and a second input for receiving said at least one shift-up control signal.

4. The circuit of claim 1 wherein the VCO input voltage modulation mechanism further includes
    a voltage shift-down mechanism for pulling down the voltage at the VCO input voltage node by drawing a level shifting current from the VCO input voltage node.

5. The circuit of claim 4 wherein the VCO input voltage modulation mechanism further includes
    a modulation control circuit for generating a shift-down control enable signal and at least one shift-down control signal for use in controlling the voltage shift-down mechanism;
    wherein the voltage shift-down mechanism includes a first input for receiving the shift-down control enable signal and a second input for receiving said at least one shift-down control signal.

6. The circuit of claim 2 wherein the voltage shift-up mechanism includes
    a first transistor having a drain electrode coupled to a first predetermined voltage, a source electrode, and a gate electrode for receiving a first shift-up control signal;
    a second transistor having a drain electrode coupled to the source electrode of the first transistor, a source electrode coupled to the VCO input voltage node, and a gate electrode for receiving a shift-up control enable signal.

7. The circuit of claim 6 wherein the voltage shift-up mechanism includes a plurality of transistors coupled In parallel to the first transistor;
    wherein each transistor includes a drain electrode that is coupled to the first predetermined voltage, a source electrode that is coupled to the drain electrode of the second transistor, and a gate electrode for receiving a corresponding shift-up control signal.

8. The circuit of claim 4 wherein the voltage shift-down mechanism includes
    a first transistor having a drain electrode coupled to the VCO input voltage node, a source electrode, and a gate electrode fix receiving a shift-down control enable signal;
    a second,transistor having a drain electrode coupled to the source electrode of the first transistor, a source electrode coupled to a second predetermined voltage, and a gate electrode for receiving a shift-down control signal.

9. The circuit of claim 8 wherein the voltage shift-down mechanism includes
    a plurality of transistors coupled in parallel to the second transistor;
    wherein each transistor includes a drain electrode that is coupled to the source of the first transistor, a source electrode that is coupled to the second predetermined voltage, and a gate electrode for receiving a corresponding shift-down control signal.

10. The circuit of claim 1 integrated in one of personal computers (PCs), computing devices, computer peripherals, office equipment, printers, network equipment, and other electronic applications where EMI reduction is needed.

11. The circuit of claim 3 wherein the modulation control circuit includes a plurality of programmable delay cells (PDCs) for generating the shift-up control signals; wherein a time delay (Delta(t)) of the delay cells is based on the modulation frequency (F _mod) and a number of modulation bite.

12. The circuit of claim 11 wherein the circuit includes a phase locked loop (PLL).

13. The circuit of claim 12 wherein the time delay of the delay cells are also determined by stability considerations for the PLL and VCO characterization.

14. The circuit of claim 11 wherein the delay cells are implemented as one of software and hardware.

15. A method for reducing electromagnetic interference (EMI) in a clock generation circuit that generates a spread spectrum clock, the clock generation circuit comprising a VCO input voltage modulation mechanism that includes a modulation control circuit, coupled to a VCO input voltage nod, for modulating a voltage at the VCO input voltage node, wherein the modulation control circuit includes a plurality of pull-up transistors, a plurality of pull-down transistors, and a plurality of programmable delay cells, the method comprising the steps of:
    a) configuring the VCO input voltage modulation mechanism; wherein said configuring the VCO input voltage modulation mechanism includes programming at least one parameter for the modulation control circuit by utilizing the plurality of pull-up transistors, the plurality of pull-down transistors, and the plurality of programmable delay cells; and wherein said at least one parameter includes one of a maximum frequency (F_max), a minimum frequency (F_min), a desired frequency (F_desired), a time between a first point and a second point on a graph of the voltage at the VCO input voltage node with respect to time, and a voltage between a first point and a second point on the graph of the voltage at the VCO input voltage node with respect to time;

b) adjusting the VCO input voltage in a first direction to cause the frequency of the output of the clock generation circuit to change in a first direction; and c) adjusting the VCO input voltage in a second direction to cause the frequency of the output of the clock generation circuit to change in a second direction.

16. The method of claim 15 wherein the clock generation circuit includes a voltage controlled oscillator (VCO) that includes an output, wherein the method further comprises the stop of:

repeating steps (b) and (c) to modulate the VCO output to reduce electromagnetic interference (EMI) of the clock signal generation circuit.

17. The method of claim 15 wherein the step of adjusting the VCO input voltage in a first direction to cause the frequency of the output of the clock generation circuit to change in a first direction includes injecting a voltage level shifting current into the VCO input voltage node; and wherein the step of adjusting the VCO input voltage in a second direction to cause the frequency of the output of the clock generation circuit to change in a second direction includes drawing a voltage level shifting current from the VCO input voltage node.

18. The method of claim 15 further comprising the step of:

employing a P-counter that has a single value.

19. The circuit of claim 1 further comprising:

a P-counter that includes an input coupled to the VCO, a register for storing a single P value and an output;

a Q-counter that includes an input for receiving a reference frequency (F_in) and an output;

a phase detector that includes a first input coupled to the output of the Q counter (F_ref) and a second input coupled to the output of the P counter (F_fb) and an output for generating a control signal;

a charge pump coupled to the phase detector for receiving the control signal and selectively charging and discharging the voltage control node based on the control signal; and a loop filter.

20. The circuit of claim 5 wherein the modulation control circuit includes a plurality of programmable delay cells (PDCS) for generating the shift-down control signals; wherein a time delay (Delta(t)) of the delay cells is based on the modulation frequency (F_mod) and a number of modulation bits.

* * * * *

UNITED STATES PATENT AND TRADEMARK OFFICE
CERTIFICATE OF CORRECTION

PATENT NO. : 7,167,059 B2 Page 1 of 1
APPLICATION NO. : 10/820691
DATED : January 23, 2007
INVENTOR(S) : Robert Abraham It is certified that error appears in the above-identified patent and that said Letters Patent is hereby corrected as shown below:

Col. 11, line 18; In Claim 1, delete "(F _out)" and insert -- (F_out) --.
Col. 12, line 7; In Claim 7, delete "In" and insert -- in --.
Col. 12, line 18; In Claim 8, delete "fix" and insert -- for --.
Col. 12, line 20; In Claim 8, delete "second,transistor" and insert -- second transistor --.
Col. 12, line 41; In Claim 11, delete "(F _mod)" and insert -- (F_mod) --.
Col. 12, line 42; In Claim 11, delete "bite." and insert -- bits. --.
Col. 13, line 17; In Claim 16, delete "stop" and insert -- step --.
Col. 14, line 21; In Claim 20, delete "(PDCS)" and insert -- (PDCs) --.

Signed and Sealed this

Sixth Day of May, 2008

JON W. DUDAS
*Director of the United States Patent and Trademark Office*